US012689331B2

(12) United States Patent
Mohr et al.

(10) Patent No.: US 12,689,331 B2
(45) Date of Patent: Jul. 21, 2026

(54) ELECTRONIC CIRCUIT LINEARIZATION METHOD

(71) Applicants: Daniel R. Mohr, Allentown, NJ (US); Burton E. Sarnoff, Aspers, PA (US)

(72) Inventors: Daniel R. Mohr, Allentown, NJ (US); Burton E. Sarnoff, Aspers, PA (US)

( * ) Notice: Subject to any disclaimer, the term of this patent is extended or adjusted under 35 U.S.C. 154(b) by 397 days.

(21) Appl. No.: 18/444,412

(22) Filed: Feb. 16, 2024

(65) Prior Publication Data

US 2025/0266794 A1     Aug. 21, 2025

(51) Int. Cl.
H03F 1/32 (2006.01)
H03F 1/30 (2006.01)
H03F 3/45 (2006.01)

(52) U.S. Cl.
CPC ........... H03F 1/3211 (2013.01); H03F 1/302 (2013.01); H03F 3/45085 (2013.01)

(58) Field of Classification Search
CPC ..... H03F 1/3211; H03F 1/302; H03F 3/45085
USPC ........................................................ 330/296
See application file for complete search history.

(56) References Cited

U.S. PATENT DOCUMENTS 3,089,039 A * 5/1963 Abraham ................. H03K 3/26
                                                              327/192
3,233,125 A * 2/1966 Buie ......................... H03F 3/14
                                                              330/290

4,460,876 A   7/1984 Najman
4,605,906 A   8/1986 Miller
5,339,044 A * 8/1994 Perraud ................. H03F 1/3211
                                                              330/252
5,990,740 A   11/1999 Groe
6,262,631 B1  7/2001 Li
7,425,871 B2 * 9/2008 Gao ........................... H03F 1/52
                                                              330/289
8,183,918 B2 * 5/2012 Arnborg .................. H03F 3/211
                                                              330/261

FOREIGN PATENT DOCUMENTS

EP        0556927        2/1993
JP        H0214603 A * 1/1990
SU        853776 A1 * 8/1981
WO        9809335        3/1998

* cited by examiner

*Primary Examiner* — Hafizur Rahman
(74) *Attorney, Agent, or Firm* — Edison Law Group, PLLC

(57)                ABSTRACT

The invention concerns an electronic circuit which corrects for non-linearities present in transistor devices. The inventive circuit allows for the construction of amplifiers that are inherently low in distortion, eliminating the requirement for the use of feedback to linearize the amplifier. The invention is particularly useful for driving audio amplifiers, but can be used with other audio devices and amplifiers. The circuit has an input transistor connected in tandem with a second transistor. The transistor pair functions as a unit to cancel the log varying base-emitter resistance of the input transistor, while also canceling the base-emitter temperature drift of the input transistor.

11 Claims, 5 Drawing Sheets

+15V

10k

Out

Bias −0.05V

ELECTRONIC CIRCUIT LINEARIZATION METHOD

BACKGROUND OF THE INVENTION

1. Field of the Invention

This application relates in general to the field of analog electronics circuit design. More particularly, the application relates to a design for transistor circuits that linearizes gain characteristics of the amplifier.

2. Description of the Prior Art

Modern transistors have an inherent non-linearity in operation. This is explained by the Ebers-Moll equations:

$$I_E = I_{ES}\left(e^{\frac{V_{BE}}{V_T}} - 1\right)$$

$$I_C = \alpha_F I_E$$

$$I_B = (1 - \alpha_F)I_E$$

Where:

$V_T$ is the thermal voltage (approximately 26 mV at 300 K≈room temperature).

$I_E$ is the emitter current.

$I_C$ is the collector current.

$\alpha_F$ is the common base forward short-circuit current gain (approximately 0.99 up to nearly 1.0).

$I_{ES}$ is the reverse saturation current of the base-emitter diode (on the order of $10^{-15}$ to $10^{-12}$ A).

$V_{BE}$ is the base-emitter voltage.

The nonlinear component is termed "Shockley Resistance," or $R_S$ which invariably leads to distortion in the amplifier output signal. This effect is inherent in all transistor based amplifiers. $R_S$ is also temperature sensitive. $R_S \approx 0.026$ V/I, at room temperature, 300 K, I in Amps. This gives approximately 26Ω at 0.001 A.

Prior art methods of distortion reduction of amplifier gains stages typically employ signal feedback from the output node to the input node of the gain stage, sometimes across multiple gains stages, thereby using feedback to compensate for the inherent nonlinearity of the stages. These methods have several drawbacks. Deriving the input feedback signal from the output node allows undesired distortion artifacts to be present on the output node, which are subsequently passed on to the following stages and ultimately, e.g., an amplifier output. The feedback imparts changes to the overall signal that would not otherwise be present in the signal path. These changes can be perceived as a coloration of the signal, which is particularly noticeable in audio amplifiers. The capacitance and resistance of the feedback network and associated components causes a degradation of transients present in the signal. Percussive sounds such as cymbal crashes and drums are particularly impacted due to the fast transients presented by these sounds. The risetime of the transients are colored by the response of the feedback electronics.

SUMMARY OF THE INVENTION

The invention concerns an electronic circuit which corrects for non-linearities present in transistor devices. The inventive circuit allows for the construction of amplifiers that are inherently low in distortion, eliminating the requirement for the use of feedback to linearize the amplifier. The invention is particularly useful for driving audio amplifiers, but can be used with other audio devices and amplifiers. The circuit has an input transistor connected in tandem with a second transistor. The transistor pair functions as a unit to cancel the log varying base-emitter resistance of the input transistor, while also canceling the base-emitter temperature drift of the input transistor.

It is a major object of the invention to provide an improved method and circuit design for correcting for the inherent non-linearities in transistor circuits.

It is another object of the invention to provide an improved method for reducing distortion in audio amplifiers.

It is another object of the invention to provide a linearity correction technique for electronic circuits requiring minimal electronic components.

It is another object of the invention to provide a linearity correction technique for electronic circuits that does not use feedback.

It is another object of the invention to provide a linearity correction technique for electronic circuits that cancels the base-emitter temperature drift of the input transistor.

BRIEF DESCRIPTION OF THE DRAWINGS

FIG. 1 shows a first embodiment of the inventive circuit design.

DETAILED DESCRIPTION OF THE PREFERRED EMBODIMENTS

Referring now to FIGS. 1-4, embodiments and applications of the inventive method and circuit design are shown. The inventive method linearizes the gain characteristics of transistor amplifiers so as to minimize distortion without requiring feedback. The method applies standard electronic circuit components to overcome inherent current dependent nonlinearities in transistor circuits and can be employed in various forms for amplifier circuits such as operational amplifiers, RF circuits, or amplifier drivers. As stated above, the method corrects the nonlinearity caused by the Shockley Resistance $R_S$, thereby reducing distortion at each stage of signal transmission or amplification. As is known in the art, $R_S$ is temperature sensitive. The inventive method compensates for this temperature dependence, and also has an inherent noise reduction feature as will be explained in more detail below.

Figure 1:
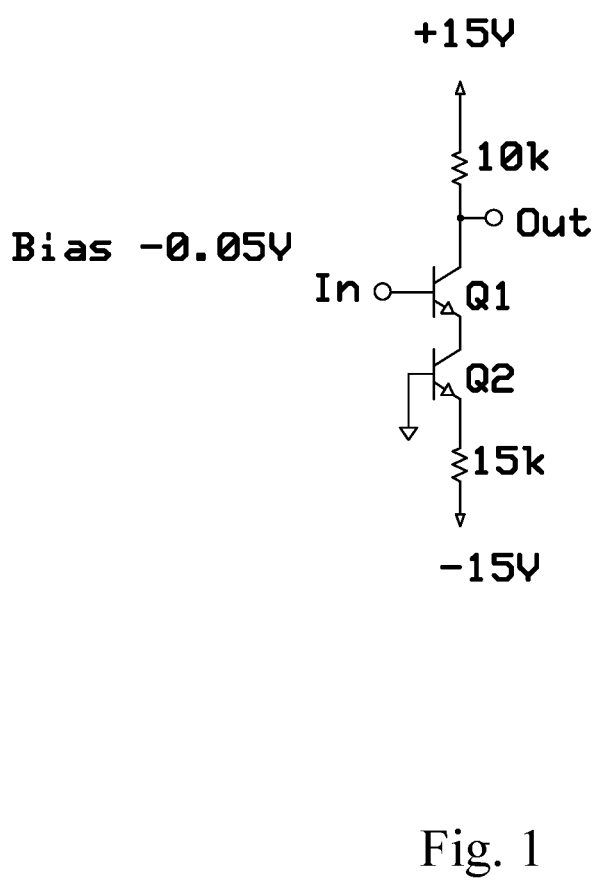

Referring now particularly to FIG. 1, two transistors in tandem Q1 and Q2 are shown. Q1 is the input transistor, with its base as the input and emitter attached to the collector of Q2. Q2 functions as a saturated constant current source with a forward biased collector base diode, thus cancelling the log varying emitter Shockley resistance of Q1. This means that the exponential nonlinearity of Q1 will be offset to a good approximation by the inverse nonlinearity of Q2. This is the basis of the present invention, the method providing a substantially linear (about 95%) element within each gain stage. Three embodiments of a circuit designed with this principle are presented.

Referring again to the first embodiment of FIG. 1, the output of the tandem is the Q1 collector. A decreasing signal on Q1 will decrease the current in Q1 in a linear manner. An increasing signal on Q1 increases Q1 current in a linear manner until Q2 comes out of saturation at which point the current in Q1 is limited to the current provided by constant current source Q2. This tandem configuration also cancels the base-emitter temperature drift of Q1. The circuit of FIG. 1 can be used in many applications such as a differential amplifiers, opamps, power amplifier drivers, RF stage circuits and other analog circuits. In the inventive arrangement, Q1 and Q2 function essentially as a linear device which is why feedback is not required to linearize the overall circuit.

Figure 2:
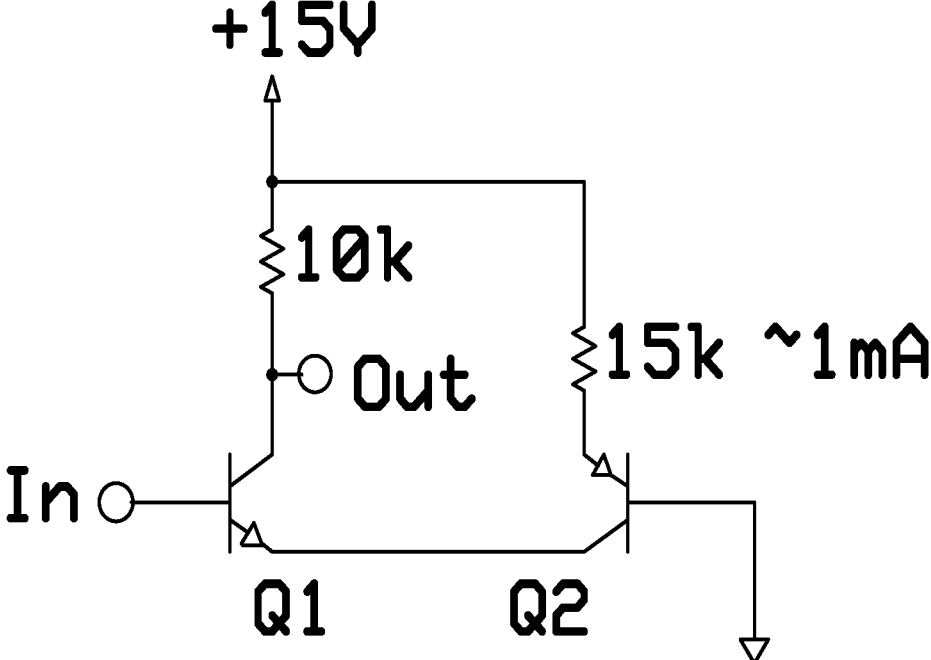
FIG. 2 shows a second embodiment of the inventive circuit design.

Referring now to FIG. 2, a second embodiment of the inventive method is shown, this embodiment using two complementary transistors in a pair, where Q1 is the input transistor, with its base as the input and its emitter attached to the collector of Q2. Q2 functions as a saturated current source for Q1. In this embodiment, the input bias voltage is adjusted for 1 mA through Q1 and Q2, approximately 1.4V. The saturated collector-base diode of Q2 thus cancels the log varying emitter resistance $R_S$ of Q1. The output of the pair is the Q1 collector. A decreasing signal on Q1 will decrease the current in Q1 in a linear manner, while an increasing signal on Q1 increases the Q1 current in a linear manner until Q2s collector base diode fully saturates and all the current flows to ground, the current can go up limited by the collector load resistor when Q1 saturates. A gain limiting resistor from Q2's base to ground can be utilized. The complementary pair Q1, Q2 also cancels the base-emitter temperature drift of Q1.

Figures 3A, 3B, 3C, 3D, 3E, 3F, 3G, 3H, 3I:
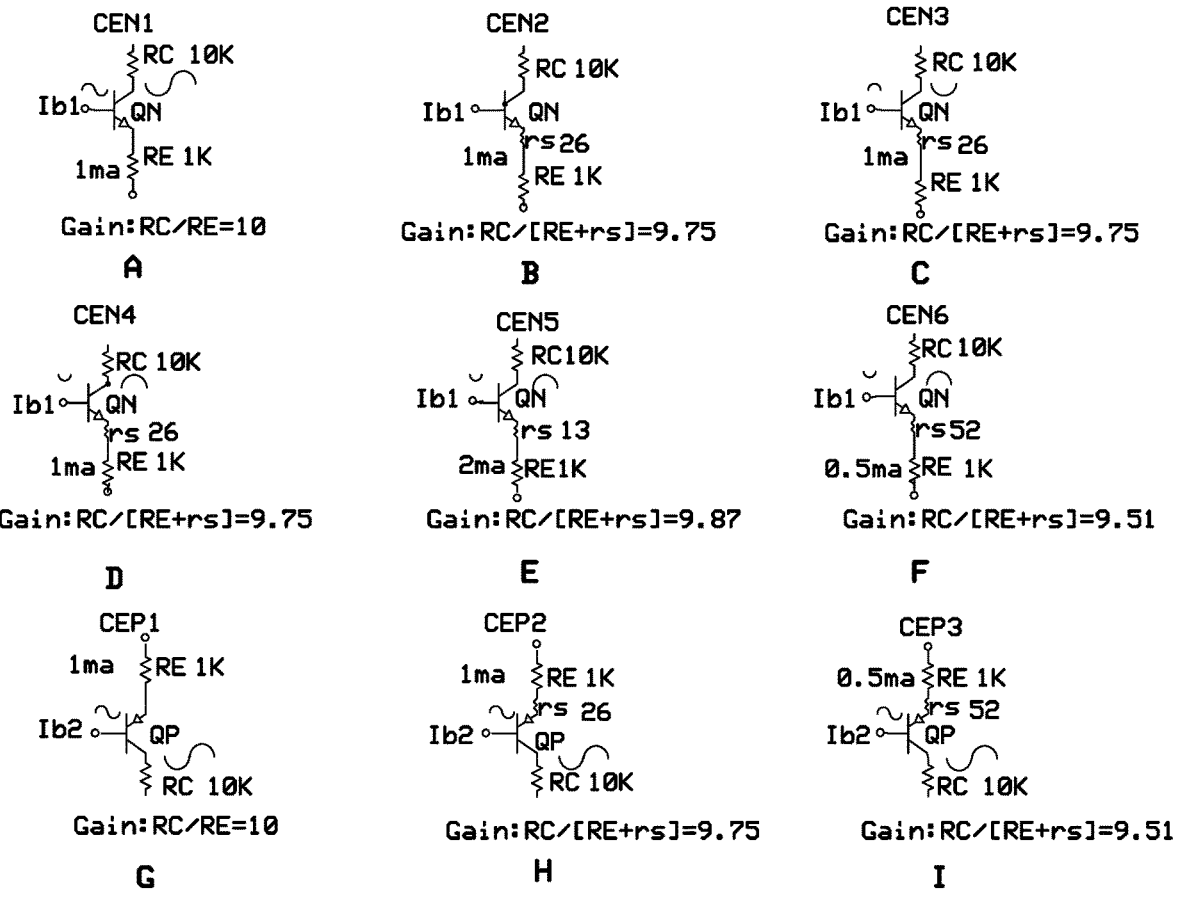
FIGS. 3A-3K shows a series of common emitter amplifiers illustrating the effect of the inventive method.
Figures 3J, 3K:
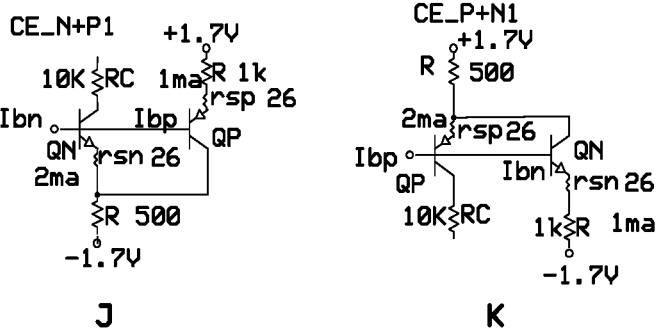

Referring now to FIGS. 3A-3I, a series of prior art circuit configurations are shown illustrating the effects of current dependent non-linearities, while FIGS. 3J and 3K show the application of the inventive method to correct for the current dependent nonlinearities. The currents and resistor loads are merely exemplary and operations are not limited to these values. FIGS. 3A-3F show common emitter amplifier circuits using NPN transistors. FIGS. 3G-3I show common emitter amplifier circuits using PNP transistors.

For all of the circuits, the base inputs are referenced at ground (zero Volts) and the chosen collector load resistor is 10 KΩ. For a nominal gain of 10, RC/RE is set to 10. The collector load bias voltage is set at +15 volts to avoid collector saturation. The emitter load biased for 1 ma emitter current. (−1.7 volts).

Ib1 is the base current which has electron flow out of the base towards ground in the NPN transistor, while Ib2 is the base current which has electron flow into the base from ground in the PNP transistor. If the transistors have a Beta of 100 then the base currents in these examples will be 10 ua.

FIGS. 3A and 3G show common emitter amplifiers for both NPN and PNP transistors showing classic static (no input signal applied) NPN and PNP configurations, with RE at −1.7 and +1.7, respectively. FIG. 3C shows a classic static NPN common emitter amplifier with real world Shockley resistance {rs=0.026/Emitter current. Rs=0.026/1 ma=26 ohms}. RE (−1.7) Gain=~9.75. FIG. 3H shows a classic static PNP common emitter amplifier with real world Shockley resistance {rs=0.026/Emitter current. Rs=0.026/1 ma=26 ohms}. RE (+1.7) Gain=~9.75.

FIGS. 3E-3I show various common emitter amplifiers (PNP and NPN), illustrating operation of the amplifiers with an applied input signal. Referring now to FIG. 3E, when the input signal goes in a positive direction the current goes up. This also makes $R_S$ go down, creating an increase in gain with varying positive signal. Gain varying with the input signal creates distortion in the collector load 'RC'.

For FIG. 3F, when the input signal goes in a negative direction this makes the current go down. This also makes $R_S$ go up, creating a decrease in gain with varying positive signal. Gain varying with the input signal creates distortion in the collector load 'RC'.

Referring again to FIG. 3A, when an input signal applied to the circuit goes positive, this creates an increase in the collector current to the load to give gain, but also causes a decrease in $R_S$, distorting the collector current. When the input signal goes negative, this creates a decrease in the collector current to the load to give gain. But this also gives an increase in $R_S$, distorting the collector current.

Ideally, linearization is greatly improved when, as the input signal goes positive, the output collector current increases and $R_S$ decreases. The present inventive method adds a parallel (to the input transistor) device so when the signal goes positive, the output collector current also increases but having $R_S$ increase and not decrease. By summing these two currents, the resulting collector current of both devices gives an increase in current, but one has a decreasing $R_S$ and the other has an increasing $R_S$ of comparable amount, thereby canceling the $R_S$ variation induced distortion.

Referring now to FIG. 3 J, the inventive method as applied to a classic common emitter amplifier is shown. This embodiment has the inputs of both the NPN and PNP transistors (QN and QP respectively) with their bases tied together, similar to combining the circuit of FIGS. 3E and 3F in a positive polarity output configuration. For a half cycle of the input signal, the emitter load REp and bias of the QP transistor is chosen for 1 ma. The QN emitter load which is also the QP collector load is chosen for 2 ma. This QP collector connection to the QN emitter is where the above summing of the signal currents occurs to provide the QN positive collector current output into the QN Collector load Rc (10 K). Since the QP current (1 ma) is decreasing and through the same 500 Ohm resistor (R500) the remainder of the R500s current increases with the QN Emitter current of 1 ma. This gives, in the collector current load of QN an increase in currents from both devices with a simultaneous current dependent Rs decrease which cancels this undesirable signal dependent varying load current, thus canceling distortion.

The base current of the QN flows into the base of QP. If the base currents are equal from matched NPN/PNP Betas then the input bias current can be effectively zero. Or at least only the difference of slightly different base currents. This makes the input impedance much higher than that of a single transistor with similar operating currents, another improvement provided by the inventive method. Another advantage of the inventive method is lower noise. The signal currents of QN and QP are magnified effectively by a factor of two. While the noise of two transistors in parallel goes up only by the square root of two. FIG. 3K shows the negative output signal version embodiment of the invention.

Figure 4:
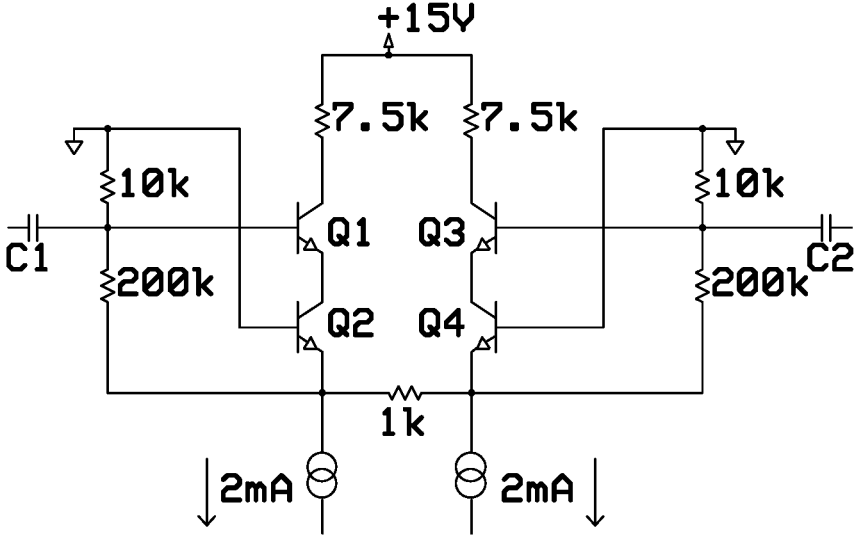
FIG. 4 is an illustration of the inventive method applied to the input of a differential amplifier.

Referring now to FIG. 4, transistors Q1 and Q3 are set up as a classic differential amplifier of the type with two individual current sources utilizing a single emitter gain determining resistor. This example shows +15 volts to supply the 7.5 K collector loads. However, their emitter connection with the inventive distortion cancellation method is described as follows:

The left side of the circuit is set up in the common emitter configuration. Q1's base is used for the input signal. Q1's collector is the output, and Q1's emitter is connected to Q2's collector. Q2 is a constant current source however its collector base diode is run in saturation. The 2 resistors' values are for example only but one skilled in the art would select values, so that the saturated current source passes half the current out of Q2's base to ground and the other half out Q2's collector supplying Q1's emitter current. Selecting the static bias can be monitored, for example, by setting Q1's collector to static mid-point for symmetrical clipping, or some other voltage to accommodate the next stage of the circuit design. The significance of the forward biased collector base diode of Q2 in series with the forward biased BASE EMITTER diode of Q1 is the distortion cancellation characteristics from the interaction of the current dependent Rs of the devices.

In operation with an input signal applied, when the input signal goes positive, Q1's current will increase, and Rs will go down. Since more current is flowing through Q1 the available current will decrease through the forward biased collector base diode of Q2 causing its Rs to go up. This countervailing interaction cancels out the current and signal dependent nonlinearities of the amplifier element, and thus distortion.

When the input signal goes negative, Q1's current will decrease, and Rs will go up. Since less current is flowing through Q1 the available current will Increase through forward biased collector base diode of Q2 causing its Shockley resistance to go down. This countervailing interaction cancels out the distortion.

The same operation on the right side occurs for Q3 and Q4. This classic differential circuit topology can be implemented such that each side of the differential has its distortion reduced independently.

It is to be understood that the present invention is not limited to the sole embodiment described above, but encompasses any and all embodiments within the scope of the following claims:

We claim:

1. A linearization circuit for transistor amplifiers comprising:
first and second transistors, said first and second transistors of like polarity and each of said transistors having a base, collector, and emitter; and base, collector, and emitter terminals;
the base terminal of said first transistor serving as an input, the first transistor having an output at its collector terminal, said first transistor emitter terminal coupled to the collector of the second transistor which functions as a current source near saturation, said second transistor connected via the emitter terminal to a voltage supply source through a resistor to provide a countervailing nonlinear current dependent collector-base Shockley resistance to the first transistor;
whereby gain response of the linearization circuit is linear relative to the input signal without using feedback.

2. The circuit of claim 1 wherein said first and second transistors are both PNP transistors.

3. The circuit of claim 1 wherein said first and second transistors are both NPN transistors.

4. The circuit of claim 1 wherein said first transistor is subject to base emitter temperature drift, and said countervailing nonlinear current dependent collector-base Shockley resistance cancels said base emitter temperature drift.

5. An electronic circuit comprising:
first and second transistors of like polarity, each of said transistors having a base, collector, and emitter; and base, collector, and emitter terminals;
the first and second transistors connected in tandem to establish a tandem input circuit, with the first transistor serving as an input device through its base terminal and having an output through its collector terminal with its emitter terminal coupled to the collector terminal of the second transistor, the second transistor functioning as a current source near saturation and connected via its emitter to a voltage supply source through a resistor to set a current, thus providing a countervailing nonlinear current dependent collector-base Shockley resistance to a nonlinear current dependent base-emitter of the first transistor, in accordance with Ebers-Moll transistor modeling;
wherein the tandem circuit produces a substantially linear gain response to the input signal without requiring use of any feedback mechanisms as well as providing temperature compensation.

6. The circuit of claim 5 wherein said first and second transistors are both PNP transistors.

7. The circuit of claim 5 wherein said first and second transistors are both NPN transistors.

8. The circuit of claim 5 wherein said first transistor is subject to base emitter temperature drift, and said countervailing nonlinear current dependent collector-base Shockley resistance cancels said base emitter temperature drift.

9. An electronic circuit comprising first and second transistors of complementary polarity each of said transistors having a base, collector, and emitter; and base, collector, and emitter terminals;
an input circuit with said first and second transistors connected in a parallel configuration with the first transistor serving as an input device through its base terminal and having an output through its collector terminal with its emitter terminal coupled to the collector terminal of the second transistor which functions as a near saturated current source when properly biased and connected via its emitter to a voltage supply source through a resistor to set a current thus providing a countervailing nonlinear current dependent collector-base Shockley resistance to the nonlinear current dependent base-emitter Shockley resistance of the first transistor, in accordance with Ebers-Moll transistor modeling, so as to produce a substantially linear gain response of the input circuit to the input signal and provide temperature compensation.

10. An electronic circuit comprising an input circuit having two transistors of complementary polarity in a parallel configuration with bases tied together, each of said transistors having an emitter load and a collector load, with the emitter load of the first transistor as the second transistor's collector load providing a current sum so that current dependent varying Shockley resistance of the first transistor is counterbalanced by an inversely varying current dependent Shockley resistance in the second transistor, thus improving gain linearity of the input circuit.

11. The circuit of claim 10 wherein said first transistor is subject to base emitter temperature drift, and said countervailing nonlinear current dependent collector-base Shockley resistance cancels said base emitter temperature drift.

* * * * *